United States Patent
Kok et al.

(10) Patent No.: US 7,679,397 B1
(45) Date of Patent: Mar. 16, 2010

(54) TECHNIQUES FOR PRECISION BIASING OUTPUT DRIVER FOR A CALIBRATED ON-CHIP TERMINATION CIRCUIT

(75) Inventors: Yew Fatt Kok, Penang (MY); Chooi Pei Lim, Penang (MY); Kok Heng Choe, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/198,049

(22) Filed: Aug. 5, 2005

(51) Int. Cl.
*H03K 19/0175* (2006.01)
(52) U.S. Cl. .............................. 326/30; 326/83; 326/87; 327/108
(58) Field of Classification Search .................. 326/21, 326/26, 30, 81–83, 86–87; 327/108–109
See application file for complete search history.

(56) References Cited

U.S. PATENT DOCUMENTS

| | | |
|---|---|---|
| 4,719,369 A | 1/1988 | Asano et al. |
| 4,954,729 A | 9/1990 | Urai |
| 5,111,081 A | 5/1992 | Atallah |
| 5,134,311 A | 7/1992 | Biber et al. |
| 5,164,663 A | 11/1992 | Alcorn |
| 5,179,300 A | 1/1993 | Rolandi et al. |
| 5,359,235 A | 10/1994 | Coyle et al. |
| 5,374,861 A | 12/1994 | Kubista |
| 5,592,510 A | 1/1997 | Van Brunt et al. |
| 5,602,494 A | 2/1997 | Sundstrom |
| 5,623,216 A | 4/1997 | Penza et al. |
| 5,656,953 A | 8/1997 | Whetsel |
| 5,721,548 A | 2/1998 | Choe et al. |
| 5,726,582 A | 3/1998 | Hedberg |
| 5,726,583 A | 3/1998 | Kaplinsky |
| 5,764,080 A | 6/1998 | Huang et al. |
| 5,864,715 A | 1/1999 | Zani et al. |
| 5,939,896 A | 8/1999 | Hedberg |
| 5,955,894 A | 9/1999 | Vishwanthaiah et al. |
| 5,955,911 A | 9/1999 | Drost et al. |
| 5,970,255 A | 10/1999 | Tran et al. |
| 6,008,665 A | 12/1999 | Kalb et al. |

(Continued)

OTHER PUBLICATIONS

"Apex 20K Programmable Logic Device Family ver. 3.7," product data sheet Altera Corporation, San Jose, CA (May 2001).

(Continued)

*Primary Examiner*—Vibol Tan
*Assistant Examiner*—Christopher Lo
(74) *Attorney, Agent, or Firm*—Townsend and Townsend and Crew LLP

(57) ABSTRACT

Techniques are provided for controlling an on-chip termination (OCT) in an output driver. The OCT control circuit calibrates the effective resistance of transistors in the output driver to match an external resistor using a feedback loop. The feedback loop monitors the output voltage and generates an analog calibration signal that varies the output impedance of a selected group of the output transistors that are enabled to drive the output terminal. Digital signals under the control of the user select the number of output transistors to be enabled based on the output driver requirements of the circuit. The analog calibration signal varies the signal level driving the selected output transistors to modify the effective output impedance of the circuit for better termination matching.

29 Claims, 4 Drawing Sheets

U.S. PATENT DOCUMENTS

| | | | |
|---|---|---|---|
| 6,020,760 A | 2/2000 | Sample et al. | |
| 6,026,456 A | 2/2000 | Ilkbahar | |
| 6,037,798 A | 3/2000 | Hedberg | |
| 6,049,255 A | 4/2000 | Hagberg et al. | |
| 6,060,907 A * | 5/2000 | Vishwanthaiah et al. | 326/87 |
| 6,064,224 A | 5/2000 | Esch, Jr. et al. | |
| 6,087,847 A | 7/2000 | Mooney et al. | |
| 6,097,208 A | 8/2000 | Okajima et al. | |
| 6,100,713 A | 8/2000 | Kalb et al. | |
| 6,118,310 A | 9/2000 | Esch | |
| 6,147,520 A | 11/2000 | Kothandaraman et al. | |
| 6,154,060 A | 11/2000 | Morriss | |
| 6,157,206 A | 12/2000 | Taylor et al. | |
| 6,181,157 B1 | 1/2001 | Fiedler | |
| 6,236,231 B1 | 5/2001 | Nguyen | |
| 6,252,419 B1 | 6/2001 | Sung et al. | |
| 6,329,836 B1 | 12/2001 | Drost et al. | |
| 6,356,105 B1 * | 3/2002 | Volk | 326/30 |
| 6,356,106 B1 | 3/2002 | Greef et al. | |
| 6,362,644 B1 | 3/2002 | Jeffrey et al. | |
| 6,366,128 B1 | 4/2002 | Ghia et al. | |
| 6,384,621 B1 * | 5/2002 | Gibbs et al. | 326/30 |
| 6,411,126 B1 | 6/2002 | Tinsley et al. | |
| 6,414,512 B1 | 7/2002 | Moyer | |
| 6,424,169 B1 | 7/2002 | Partow et al. | |
| 6,433,579 B1 | 8/2002 | Wang et al. | |
| 6,445,245 B1 | 9/2002 | Schultz et al. | |
| 6,445,316 B1 * | 9/2002 | Hsu et al. | 341/120 |
| 6,448,813 B2 | 9/2002 | Garlepp et al. | |
| 6,466,063 B2 | 10/2002 | Chen | |
| 6,489,837 B2 | 12/2002 | Schultz et al. | |
| 6,504,397 B1 | 1/2003 | Hart et al. | |
| 6,509,756 B1 * | 1/2003 | Yu et al. | 326/30 |
| 6,586,964 B1 | 7/2003 | Kent et al. | |
| 6,590,413 B1 | 7/2003 | Yang | |
| 6,603,329 B1 | 8/2003 | Wang et al. | |
| 6,605,958 B2 | 8/2003 | Bergman et al. | |
| 6,639,397 B2 | 10/2003 | Roth et al. | |
| 6,642,741 B2 | 11/2003 | Metz et al. | |
| 6,683,482 B2 | 1/2004 | Humphrey et al. | |
| 6,700,823 B1 | 3/2004 | Rahman et al. | |
| 6,710,618 B1 | 3/2004 | Murray | |
| 6,747,475 B2 | 6/2004 | Yuffe et al. | |
| 6,756,810 B2 * | 6/2004 | Mughal et al. | 326/30 |
| 6,762,620 B2 * | 7/2004 | Jang et al. | 326/30 |
| 6,766,155 B2 | 7/2004 | Salcido et al. | |
| 6,788,101 B1 | 9/2004 | Rahman | |
| 6,828,820 B2 * | 12/2004 | Ohno | 326/30 |
| 6,836,144 B1 | 12/2004 | Bui et al. | |
| 6,947,859 B2 * | 9/2005 | To et al. | 702/67 |
| 6,980,020 B2 * | 12/2005 | Best et al. | 326/30 |
| 7,002,367 B2 * | 2/2006 | Yu et al. | 326/30 |
| 7,084,662 B1 * | 8/2006 | Om et al. | 326/30 |
| 7,148,721 B2 * | 12/2006 | Park | 326/30 |
| 7,196,567 B2 * | 3/2007 | Nguyen | 327/308 |
| 7,368,951 B2 * | 5/2008 | Iwasaki | 326/86 |
| 2002/0010853 A1 | 1/2002 | Trimberger et al. | |
| 2002/0060602 A1 | 5/2002 | Ghia et al. | |
| 2002/0101278 A1 | 8/2002 | Schultz et al. | |
| 2003/0062922 A1 | 4/2003 | Douglass et al. | |
| 2003/0218477 A1 * | 11/2003 | Jang et al. | 326/30 |
| 2004/0008054 A1 | 1/2004 | Lesea et al. | |
| 2004/0090239 A1 * | 5/2004 | Ikeoku et al. | 326/30 |
| 2006/0158213 A1 * | 7/2006 | Allan | 326/30 |

OTHER PUBLICATIONS

"Apex II Programmable Logic Device Family ver. 1.1," product Data Sheet, Altera Corporation San Jose, CA (May 2001).

Bendak et al. "CMOS VLSI Implementation of Gigabyte/second computer network links," proceedings of the 1996 IEEE International Symposium on Circuits and Systems 2:269-272 (May 1996).

Boni et al. "LVDS I/O Interface for Gb/s-per-Pin Operation in 0.35-um CMOS," IEEE Journal of Solid-State Circuits 36(4):706-711 (Apr. 2001).

Esch et al. "Theory and Design of CMOS HSTL I/O Pads," The Hewlett Packard Journal, pp. 46-52 (Aug. 1998).

"Spartan-3 1.2V FPGA Family: Functional Description, CA DS099-2 (v1.2)," product specifications Xilinx, Inc., San Jose (Jul. 11, 2003).

"Virtex-II 1.5V Field Programmable Gate Arrays, DSO3102 (v1.5)," product specifications Xilinx, Inc., San Jose, CA (Apr. 2, 2001).

"Virtex-II Platform FPGAs: Detailed Description, DS031-2 (v3.1)," product specifications Xilinx, Inc., San Jose, CA (Oct. 14, 2003).

"Virtex-II Pro Platform FPGAs: Functional Description, DS083-2 (v2.9)," product specifications Xilinx, Inc., San Jose, CA, (Oct. 14, 2003).

* cited by examiner

US 7,679,397 B1

TECHNIQUES FOR PRECISION BIASING OUTPUT DRIVER FOR A CALIBRATED ON-CHIP TERMINATION CIRCUIT

BACKGROUND OF THE INVENTION

The present invention relates to techniques for controlling on-chip termination resistance, and more particularly, to techniques for precision biasing output drivers for controlling an on-chip termination resistance.

When transmitting signals over distances that are appreciable with respect to the signal period, mismatches between the impedance of the transmission line and that of the receiver cause signal reflection. The reflected signal interferes with the transmitted signal and causes distortion and degrades the overall signal integrity. To minimize or eliminate the unwanted reflection, transmission lines are resistively terminated by a matching impedance. In the case of integrated circuits that are in communication with other circuitry on a circuit board, termination is often accomplished by coupling an external termination resistor to the relevant input/output (I/O) pins.

For many of today's high speed integrated circuits, and particularly those that have large I/O pin counts, external termination poses a number of problems. A termination resistor is typically coupled to every I/O pin receiving an input signal from a transmission line. Often hundreds of termination resistors are needed for an integrated circuit. Numerous external termination resistors can consume a substantial amount of board space. The use of external components for termination purposes can be cumbersome and costly, especially in the case of an integrated circuit with numerous I/O pins.

Signal integrity is critical in digital design as system speeds and clock edge rates continue to increase. To improve signal integrity, both single-ended and differential signals should be properly terminated. Termination can be implemented with external termination resistors on a board or with on-chip termination technology. On-chip termination eliminates the need for external resistors and simplifies the design of a circuit board.

There is some degree of flexibility provided by circuits such as field programmable gate arrays (FPGAs) wherein a user may be provided the option of programmable changing the output driver settings. To reduce die size, an FPGA design may be converted to a structured application specific integrated circuit (ASIC) using a mask field programmable gate array (MFPGA) that fixes the switch settings. This conversion which removes the programmability of the switches and routing become economically desirable at higher volumes. In a structured ASIC design, therefore, the user may loses the option to change the output driver settings. The output drive strength is set according to the user's FPGA design, and the setting is hardwired in the structured ASIC.

A circuit designer can map a user's I/O drive strength settings from an FPGA to a structured ASIC through simulation or test chip correlation. However, process, voltage, and temperature (PVT) variations and other parasitic effects can complicate the mapping effort. Therefore, such a mapping process is not desirable, because the FPGA-to-structured ASIC conversion process typically has a short turn-around time.

One of the objectives when converting an FPGA design into a structured ASIC design is to reduce the die size and the chip production cost. One way to reduce die size is to reduce the number of user drive strength options in the I/O drivers of the structured ASIC design. However, removing user drive strength options compromises the I/O drive strength resolution. As a result, the user may have to settle for a drive strength setting that is different from the FPGA. The user typically wants to keep the same drive strength setting so that the structured ASIC can interface with neighboring chips with the same drive strength settings used in the FPGA.

It would therefore be desirable to implement termination resistance on-chip to reduce the number of external components. It would also be desirable to provide accurate control of an on-chip termination resistance. It would further be desirable to provide the user with the flexibility to adjust the drive strength setting of an I/O driver in a structured ASIC.

BRIEF SUMMARY OF THE INVENTION

The present invention provides techniques for controlling an on-chip termination (OCT) circuit in an output driver. An OCT control circuit of the present invention calibrates the effective resistance of transistors in the output driver to match an external resistor using a feedback loop. The OCT control circuit can compensate for process, voltage, and temperature variations on the integrated circuit that can effect the OCT.

The present invention also allows additional control over the amount of drive current strength in the output driver by disabling one or more of a set of parallel coupled drive transistors in the output driver. The drive current strength of the output driver can also be controlled by adding or subtracting the digital value of count signals generated by a counter circuit. The count signals are then converted into an analog signal that is used to control the amount of current that flows through the drive transistors. These features of the present invention allow the output drive current of a structured ASIC to be more accurately matched to the drive current setting in a user's FPGA design.

Other objects, features, and advantages of the present invention will become apparent upon consideration of the following detailed description and the accompanying figures, in which like reference designations represent like features throughout the figures.

DETAILED DESCRIPTION OF THE INVENTION

Figure 1:
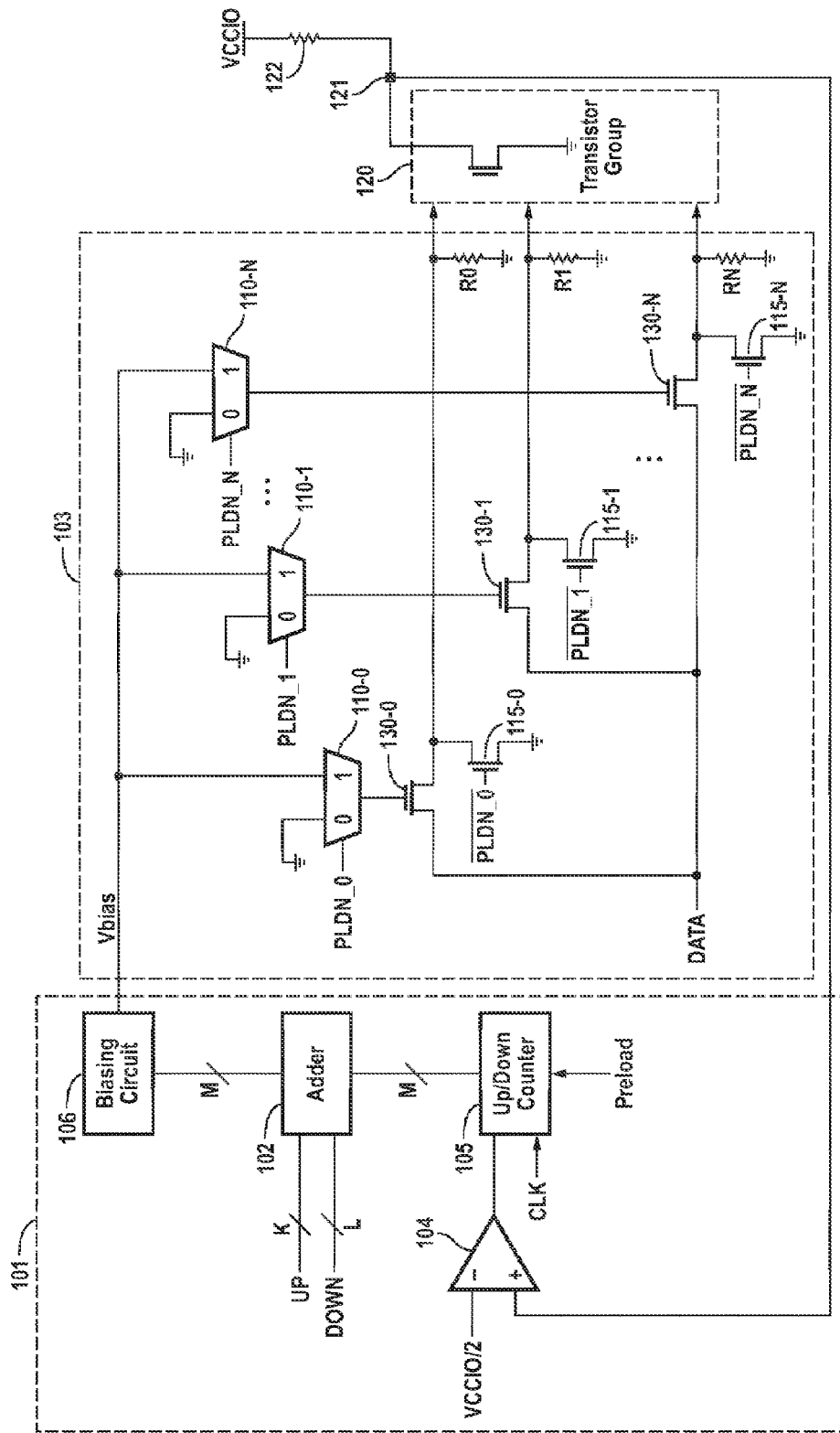
FIG. 1 illustrates an on-chip termination calibration circuit with pull-down transistors according to a first embodiment of the present invention.

According to one embodiment of the present invention series on-chip termination (OCT) is provided by controlling the drive current strength of the transistors in an input/output (IO) driver, to achieve a desired effective resistance. FIG. 1 is an exemplary and simplified circuit diagram for an implementation of an on-chip termination control circuit according to a first embodiment of the present invention. The control circuitry shown in FIG. 1 controls the series termination resistance provided by pull-down NMOS transistors in transistor group 120. It is to be understood that the techniques of the present invention can also be applied to parallel OCT.

Transistor group 120 includes a group of parallel coupled NMOS field effect transistors that couple an output terminal 121 to a low power supply rail or ground. The transistors in group 120 can have the same or different channel width-to-length ratios. Transistor group 120 can have any number of transistors with any suitable channel W/L ratios. For example, transistor group 120 can have 7 parallel coupled transistors that have the following channel W/L ratios, 1×, 2×, 4×, 8×, 16×, 32×, and 64×. Different combinations of the NMOS transistors are turned on (enabled) to vary the effective drive and resistance of transistor group 120.

Transistors in group 120 are coupled to an output pin 121 as shown. A user can couple an external resistor 122 to terminal 121 to select the series termination resistance for the pull-down NMOS transistors in transistor group 120. Resistor 122 can be any desired value (e.g., 50 ohms). Details are now discussed regarding how the control circuitry of FIG. 1 calibrates the series on-chip termination (OCT) by controlling the resistance of the transistors in group 120.

During the OCT calibration process, the DATA signal is high so that the selected transistors in transistor group 120 can be turned on. The selection of transistors in transistor group 120 is based on the user's output drive requirements and will be described further below. The transistors in group 120 and external resistor 122 implement a resistor divider at output terminal 121. The OCT auto-calibration circuit of FIG. 1 includes a feedback circuit 101 that monitors the signal at the output terminal 121 and generates an analog calibration signal Vbias at its output, and a calibration circuit 103 that adjusts the output impedance of output transistor 120 in response to the calibration signal Vbias. Specifically, the voltage at output terminal 121 is fed back to the positive (plus) input of a comparator 104. The voltage at the positive input of comparator 104 thus varies in response to the effective resistance of transistor group 120. The negative input of comparator 104 is connected to a reference voltage, in this example, VCCIO/2, wherein VCCIO is the high supply voltage.

If the voltage at the positive input of comparator 104 (i.e., voltage at terminal 121) is higher than the voltage at the negative input of comparator 104 (VCCIO/2), the output voltage of the comparator is high. The output of comparator 104 connects to an up/down counter circuit 105. When the output of comparator 104 is high, up/down counter 105 counts up in response to a clock signal CLK. Counter 105 is an M-bit counter, where M is a positive integer selected based on the resolution of the calibration required by the design. For example, if up/down counter 105 is a 7-bit counter (i.e., M=7), a 7-bit value of the count signals may increase from 0000001 to 0000010 to 0000011, across three clock cycles, where the ones and zeros correspond to digital high and low voltages, respectively.

The M-bit output of counter 105 is fed into an adder circuit 102. As will be described in greater detail below, adder circuit 102 is optional and when included in the circuit it provides an additional level of control to the user through user-controllable signals UP and DOWN. Once adjusted by adder circuit 102, the M-bit count signal is fed into a biasing circuit 106. Biasing circuit 106 essentially performs a digital to analog conversion (DAC), converting the M-bit binary signal into one of multiple discrete analog calibration signals at its output.

The analog output Vbias of biasing circuit 106 is applied to one input of a group of multiplexers 110-1 to 110-N. In this example, multiplexers 110 are selection circuits that selectively couple signals at one of two inputs to their output in response to a control signal. The second input of each multiplexer 110 couples to logic low signal or ground. The number of multiplexers 110-0 to 110-N corresponds to the number of transistors in the group of transistors 120. In response to control signals PLDN_0 to PLDN_N, multiplexers 110-0 to 110-N selectively couple Vbias to gate terminals of pass transistors 130-0 to 130-N. The analog signal Vbias thus controls the channel resistance of transistors 130-0 to 130-N. When turned on, the channel resistance of transistors 130-0 to 130-N and resistive elements R-0 to R-N form resistive voltage dividers that can vary the voltage at the gate terminal of transistors 120, an therefore the output impedance of transistors 120. It is to be understood that resistive elements R-0 to R-N have been shown here as simple resistors to facilitate understanding of the circuit, and that these resistive elements can be implemented in a variety of ways including by transistors.

Accordingly, feedback circuit 101 along with calibration circuit 103 form a feedback loop that automatically regulates the effective resistance of the transistors in group 120 by controlling the level of the signal that drives transistors 120. The circuit operates to adjust the effective termination resistance of transistor group 120 to match the resistance of external resistor 122. The feedback loop can be enabled throughout the operation of the circuit such that calibration of the OCT resistance occurs continuously ("on-the-fly"). Such dynamic OCT calibration will correct for undesirable deviations in the termination resistance of transistor group 120 caused by process, voltage, and temperature variations on the integrated circuit and other parasitic effects. Alternatively, the calibration process can be performed on a one-time basis upon initialization or power-up, or any other one-time trigger by the user.

Figure 2:
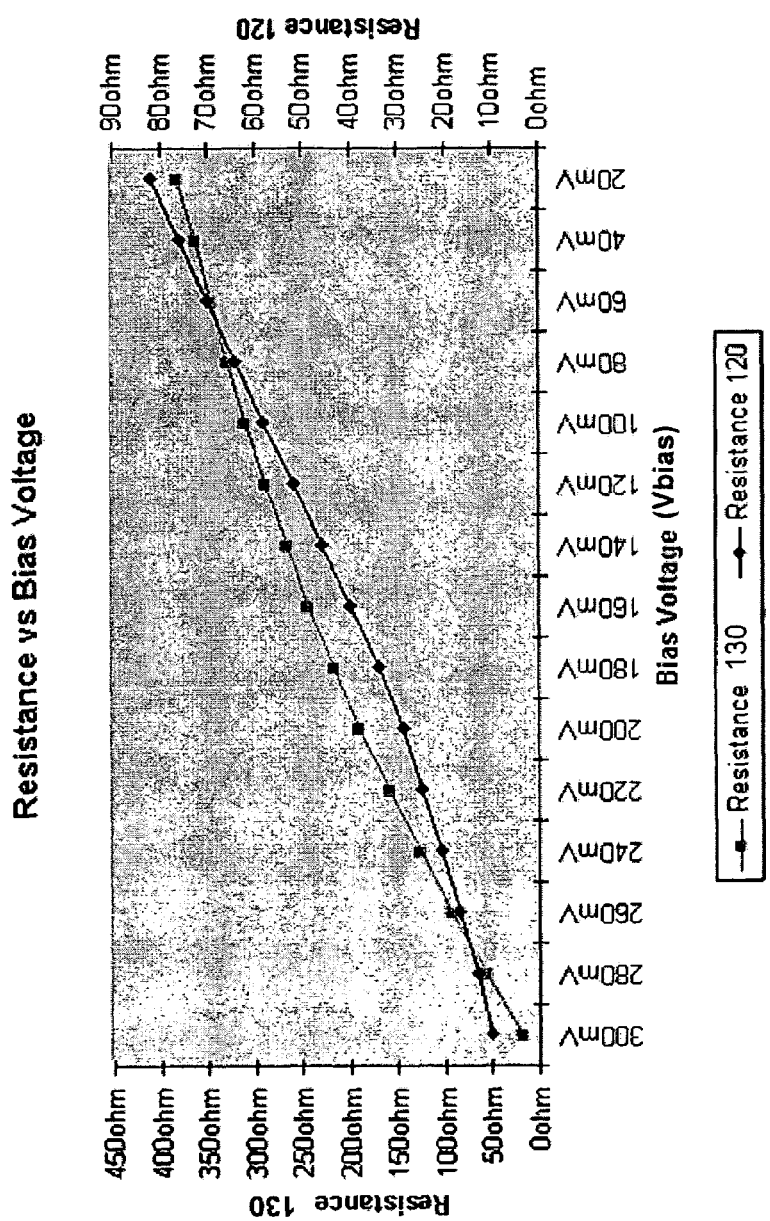
FIG. 2 is a chart illustrating one example of variations in output impedance obtained by the auto-calibration circuit according to one embodiment of the present invention.

The operation of the circuit of FIG. 1 will now be described in greater detail. Assuming a pre-calibration condition wherein transistor group 120 is essentially at high impedance, the effective resistance of transistor group 120 or RI 20 is greater than the resistance of external resistor 122 or R121. The voltage at the output terminal 121 (or V121) is therefore above VCCIO/2. With V121 greater than VCCIO/2, the output of comparator 104 is high causing up-down counter 105 to increment the binary value of its M-bit output in response to CLK. This translates to a higher Vbias at the output of biasing circuit 106, which in turn decreases the channel resistance of the selected transistors 130-0 to 130-N. Selected transistors 130 are those whose gate terminals are coupled to the analog bias signal Vbias by their respective multiplexers 110 in response to control signals PLDN. Those transistors 130 whose gate terminals are coupled to ground through their respective multiplexers 110 are turned off and their respective transistor in the group of transistors 120 is disabled. As the resistance of selected transistors 130-0 to 130-N decreases the voltage level at the gate terminals of respective transistors 120 increases. A higher voltage at the gate terminals of the selected transistors 120 causes the effective resistance of transistors 120 to decrease. This in turn will cause the voltage at terminal 121 to drop lower and closer to VCCIO/2. FIG. 2 illustrates the relationship between the bias voltage Vbias and the resistances of selected transistors 130 and 120 in FIG. 1, using exemplary values for illustrative purposes. As depicted in FIG. 2, as the value of bias voltage Vbias increases both the resistance of selected transistors 130 and the resistance of correspondingly selected transistors 120 decrease in the manner shown.

The feedback loop described above will operate until the output voltage at terminal 121 reaches VCCIO/2. At this point, the output impedance of transistor group 120 (OCT) and the external resistor 122 are matched. To maintain this condition, once comparator 104 switches state, up/down counter 105 can be locked to maintain Vbias at a constant value. This provides a one-time calibration that can be triggered by the user at any desired time. Alternatively, the circuit may allow comparator 104 to continuously switch states as the output voltage V121 moves above and below VCCIO/2 to provide real-time and dynamic impedance matching. A variation on this embodiment can build a small amount of hysteresis into comparator 104 which will require the output voltage V121 to deviate from VCCIO/2 by a small percentage before the state of the comparator switches. This will avoid on-going oscillation of the comparator output in those applications where the auto-calibration circuit is enabled continuously.

The function of adder circuit 102 will now be described. The count signals generated by up/down counter 105 are provided to an adder circuit 102. Adder circuit 102 also receives two sets of UP and DOWN control signals. Adder circuit 102 receives a K-bit UP signal and an L-bit down signal, where K and L are positive integers that are designed based on the user's requirements. Adder circuit 102 is a digital adder that can add or subtract values from the M-bit count signal. The UP and DOWN signals represent digital codes that indicate how much to increase or decrease the value of the M-bit count signal (e.g., by 1, 2, 3, 4, 5, etc.). The UP and DOWN count signals are mutually exclusive in the sense that adder circuit 102 can increase or decrease the count signals, but it cannot do both at the same time.

The inclusion of adder circuit 102 is optional and it provides a user with added flexibility to adjust the drive current strength of the transistors in group 120 by placing signals UP and DOWN under the control of the user. For example, a user can increase the digital value of the count signals by setting the UP signals to a desired level. Increasing the digital value of the count signals causes biasing circuit 106 to increase its analog output signal, which increases the drive voltage for transistor group 120. Also, a user can decrease the digital value of the count signals by setting the DOWN signals to a desired level. Decreasing the digital value of the count signals causes biasing circuit 106 to decrease its analog output signal, which decreases the drive voltage for transistor group 120.

As described above, multiplexers 110-0 to 110-N couple gate terminals of transistors 130-0 to 130-N either to ground or to bias voltage Vbias in response to control signals PLDN_0 to PLDN_N. The number of multiplexers and transistors 130-0 to 130-N correspond to the number of transistors in group 120. Signals PLDN_0, PLDN_1, . . . PLDN_N can be control signals that are set by the user (e.g., by configuration data in an FPGA), generated by other circuitry on the integrated circuit, or generated by an external source. When a given PLDN_i signal couples ground to the gate terminal of its respective transistor 130-i, that transistor is turned off disconnecting the data path from its respective output transistor 120-i. The complement of signals PLDN_0, PLDN_1, . . . PLDN_N are applied to gate terminals of transistors 115-0 to 115-N, respectively, as shown. Thus, when a given transistor 130-i is turned off by PLDN_i, its corresponding pull-down transistor 115-i is turned on to couple the gate terminal of the respective output transistor 120-i to ground. For example, a user can set PLDN_0 low to cause multiplexer 110-0 to couple the gate of transistor 130-0 to ground, causing transistor 130-0 to turn off. Setting PLDN_0 low also causes transistor 115-0 to turn on, coupling the gate terminal of its corresponding output transistor 120-i to ground and turning off that transistor. By controlling the signals PLDN_0 to PLDN_N the user can not only selectively enable a desired number of output transistors 120 that drive the output terminal 121, but can also control their output impedance via the OCT calibration circuit.

The OCT calibration circuit of the present invention can be implemented in a variety of integrated circuits. For example, one class of integrated circuits that can benefit from the present invention is programmable logic devices (PLDs) and structured ASICs that are derived from PLDs. In a PLD or FPGA, automatic calibration of an OCT circuit can be performed while the integrated circuit is being programmed (configured). As described above, however, in a structured ASIC, the programming phase is removed, leaving very little time for the automatic calibration process for the OCT circuit. To compensate for the reduced time, a delayed instant-on mode can be introduced during the start-up of a structured ASIC to allow time for the OCT to calibrate. The instant-on mode fills the period of time between power-up and normal operation of the circuit. However, in many applications it is desirable to reduce the duration of the instant-on mode as much as possible. To speed up the OCT calibration time in a structured ASIC, a designer can pre-load counter 105 with an initial count value that corresponds to the I/O drive current settings in the user's FPGA design.

As discussed above, the conversion of an FPGA design into a structured ASIC design may require the designer to sacrifice some of the user's FPGA drive current strength options to reduce die size. The present invention helps add increased drive current strength flexibility by allowing the drive current to be adjusted using adder circuit, as described in detail above. These features provide a fine degree of controllability over the driver current allowing an I/O driver to be precisely biased to improve the impedance matching accuracy. At the same time, the die size of the integrated circuit can be reduced to meet the requirements of a structured ASIC.

The present invention also helps to speed up the turn-around time for conversion from a FPGA design to a structured ASIC/MFPGA design. The present invention can also achieve a high OCT calibration speed when initial count values corresponding to a user's FPGA drive current settings are pre-loaded into counter 105.

Figure 3:
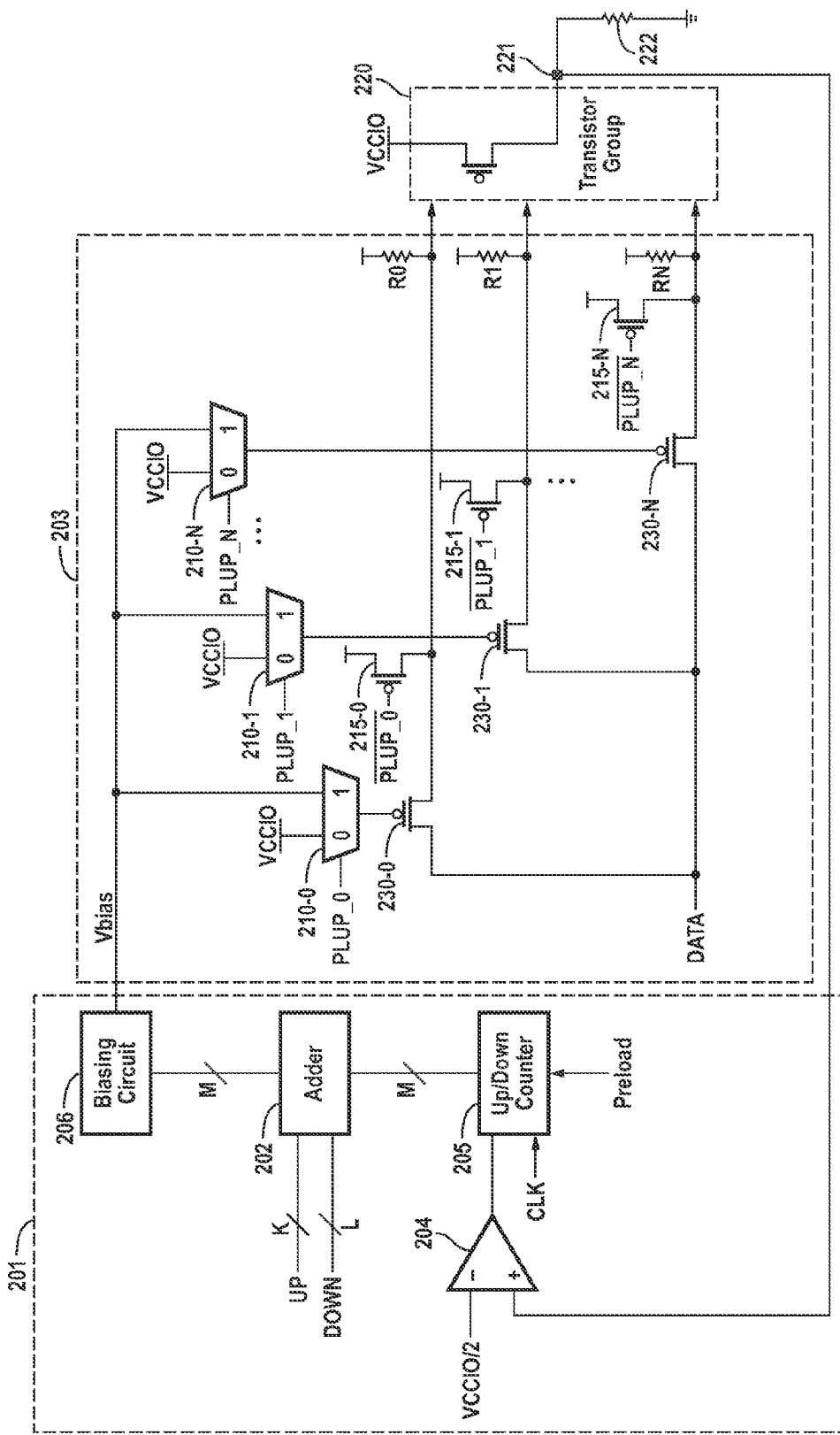
FIG. 3 illustrates an on-chip termination calibration circuit with pull-up transistors according to a second embodiment of the present invention.

FIG. 3 illustrates a further embodiment of the present invention. The circuitry of FIG. 3 controls the series on-chip termination (OCT) of pull-up PMOS field effect transistors in transistor group 220. Transistor group 220 is coupled to output pin 221 and external resistor 222. The OCT control circuitry in FIG. 3 functions in much the same manner as the OCT control circuitry of FIG. 1. FIG. 3 can have any number of transistors in group 220 and a corresponding number of multiplexers 210 and pass transistors 230.

Comparator 204 compares the voltage at pin 221 to VCCIO/2 and controls up/down counter 205. An analog calibration signal is generated by biasing circuit 206 in response to the count signal at the output of counter 205. In a similar manner as in the circuit of FIG. 1, the drive current of transistor group 220 can be controlled by the control signals PLUP_0, PLUP_1, to PLUP_N that couple either logic high voltage or the output of biasing circuit 206 (Vbias) to gate terminals of pass transistors 230-0 to 230-N. A given pass transistor 230-i and its corresponding complementary transistor 215-i either couple the logic value of DATA to the gate terminal of an associated output driver transistor 220-i or turn off the associated output driver transistor 220-I, in response to control signal PLUP_i. The output impedance of output transistor 220 is thus calibrated by the analog calibration signal as well as control signals PLUP_0 to PLUP_N via multiplexers 210-0 to 210-N. Calibration continues until the effective resistance of transistor group 220 matches external resistor 222. The circuit of FIG. 3 operates in the same manner and offers the same advantages as the circuit of FIG. 1.

Figure 4:
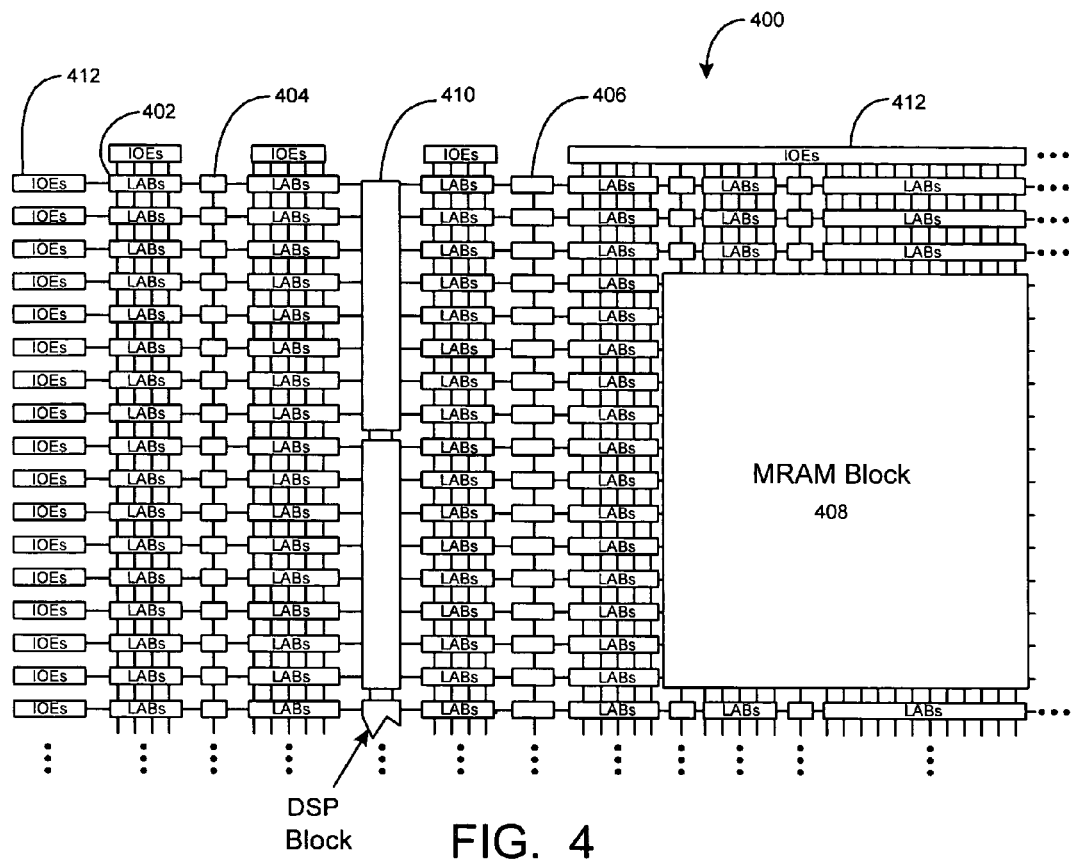
FIG. 4 is a simplified block diagram of a programmable logic device that can embody the techniques of the present invention.

FIG. 4 is a simplified partial block diagram of one example of PLD 400 that can include aspects of the present invention. It should be understood that the present invention can be applied to numerous types of integrated circuits including programmable logic integrated circuits, field programmable gate arrays, mask FPGAs, and application specific integrated circuits (ASICs). PLD 400 is an example of a programmable logic integrated circuit in which techniques of the present invention can be implemented. PLD 400 includes a two-dimensional array of programmable logic array blocks (or LABs) 402 that are interconnected by a network of column and row interconnects of varying length and speed. LABs 402 include multiple (e.g., 10) logic elements (or LEs).

An LE is a programmable logic block that provides for efficient implementation of user defined logic functions. A PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 400 also includes a distributed memory structure including RAM blocks of varying sizes provided throughout the array. The RAM blocks include, for example, 512 bit blocks 404, 4K blocks 406, and a block 408 providing 512K bits of RAM. These memory blocks can also include shift registers and FIFO buffers.

PLD 400 further includes digital signal processing (DSP) blocks 410 that can implement, for example, multipliers with add or subtract features. I/O elements (IOEs) 412 located, in this example, around the periphery of the device support numerous single-ended and differential I/O standards. It is to be understood that PLD 400 is described herein for illustrative purposes only and that the present invention can be implemented in many different types of PLDs, FPGAs, and the like.

Figure 5:
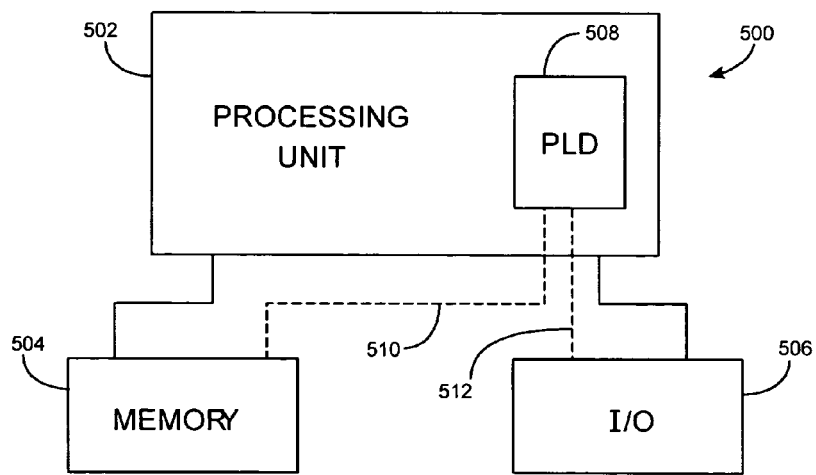
FIG. 5 is a block diagram of an electronic system that can implement embodiments of the present invention.

While PLDs of the type shown in FIG. 4 provide many of the resources required to implement system level solutions, the present invention can also benefit systems wherein a PLD is one of several components. FIG. 5 shows a block diagram of an exemplary digital system 500, within which the present invention can be embodied. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504 and an I/O unit 506 interconnected together by one or more buses. According to this exemplary embodiment, a programmable logic device (PLD) 508 is embedded in processing unit 502. PLD 508 can serve many different purposes within the system in FIG. 5. PLD 508 can, for example, be a logical building block of processing unit 502, supporting its internal and external operations. PLD 508 is programmed to implement the logical functions necessary to carry on its particular role in system operation. PLD 408 can be specially coupled to memory 504 through connection 510 and to I/O unit 506 through connection 512.

Processing unit 502 can direct data to an appropriate system component for processing or storage, execute a program stored in memory 504 or receive and transmit data via I/O unit 506, or other similar function. Processing unit 502 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 508 can control the logical operations of the system. In an embodiment, PLD 508 acts as a reconfigurable processor, which can be reprogrammed as needed to handle a particular computing task. Alternately, programmable logic device 508 can itself include an embedded microprocessor. Memory unit 504 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. For example, transistor polarities, such as those for pass transistors 130/230 and 115/215 can be modified without departing from the invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. An integrated circuit comprising:
   a plurality of parallel output transistors coupled between an external terminal and a power supply rail, each of said output transistors receiving a different control signal at its gate terminal so as to selectively drive the external terminal;
   a feedback circuit having a first input coupled to the external terminal and a second input coupled to receive a reference signal, and to generate an analog calibration signal; and
   a calibration circuit having an analog input coupled to receive the analog calibration signal, a plurality of control input terminals coupled to receive a respective plurality of control signals, and a plurality of outputs coupled to the plurality of parallel output transistors, respectively, the calibration circuit comprising a voltage divider circuit, the voltage divider circuit to divide the analog calibration signal voltage and provide the divided analog calibration signal voltage as one of the plurality of outputs to one of the plurality of parallel output transistors,
   wherein, in response to the plurality of control signals, the calibration circuit enables a selected number of the plurality of parallel output transistors.

2. The integrated circuit of claim 1 wherein the feedback circuit comprises:
   a comparator having a first input coupled to the external terminal and a second input coupled the reference signal, and an output;
   a counter coupled to the output of the comparator and to generate an M-bit digital count signal in response to a periodic signal and the output of the comparator; and a biasing circuit coupled to receive the M-bit digital count signal and to generate the analog calibration signal in response to the M-bit digital count signal.

3. The integrated circuit of claim 2 wherein the feedback circuit further comprises an adder circuit coupled between the counter and the biasing circuit, the adder circuit to modify the M-bit digital count signal in response to a user-controlled signal.

4. The integrated circuit of claim 1 wherein the voltage divider circuit comprises:
  a pass transistor coupled between a data input and a gate of one of the plurality of parallel output transistors; and
  an impedance coupled to the gate of one of the plurality of parallel output transistors.

5. The integrated circuit of claim 4 wherein the calibration circuit further comprises a plurality of disable transistors coupled to the plurality of parallel output transistors, respectively.

6. The integrated circuit of claim 1 wherein the feedback circuit and the calibration circuit operate to match the output impedance of the plurality of parallel output transistors to an external termination resistance.

7. The integrated circuit of claim 3 wherein the integrated circuit is a structured ASIC derived from an FPGA design, and wherein an initial count value corresponding to a user's FPGA drive current setting can be pre-loaded into the counter.

8. An integrated circuit comprising a calibration circuit that controls an on-chip termination resistance in an output driver coupled to a pin, the calibration circuit comprising:
  first transistors coupled in parallel and coupled to the pin, each of said first transistors receiving a different control signal at its gate terminal so as to be selectively controlled;
  a comparator circuit coupled to the pin;
  a counter circuit coupled to receive an output signal of the comparator;
  an adder circuit coupled to receive count signals generated by the counter circuit, wherein the adder circuit is coupled to receive a first input signal, where the first input signal is added to the count signals to generate digital signals; and
  a biasing circuit coupled to receive the digital signals generated by the adder circuit and to generate an analog output signal that is used to control the on-chip termination resistance of the first transistors.

9. The integrated circuit according to claim 8 further comprising:
  multiplexers having first inputs coupled to receive the analog output signal of the biasing circuit and second inputs coupled to a supply voltage.

10. The integrated circuit according to claim 9 further comprising:
  second transistors coupled between outputs of the multiplexers and the first transistors.

11. The integrated circuit according to claim 10 further comprising:
  third transistors, each of the third transistors being coupled between one of the second transistors,
  wherein one of the first transistors is disabled by enabling one of the third transistors and coupling the supply voltage to a corresponding one of the second transistors through a corresponding one of the multiplexers.

12. The integrated circuit according to claim 8 wherein the calibration circuit further comprises a voltage divider circuit to reduce the analog output signal voltage and provide the reduced analog output signal voltage to a gate of one of the first transistors.

13. The integrated circuit according to claim 8 wherein the integrated circuit is a structured ASIC having a circuit design converted from a circuit design for a field programmable gate array (FPGA).

14. The integrated circuit according to claim 13 wherein an initial count value corresponding to a user's FPGA drive current strength setting can be pre-loaded into the counter circuit.

15. A method for calibrating an on-chip termination resistance for an output driver coupled to a pin on an integrated circuit, the method comprising:
  providing on-chip termination resistance using first transistors coupled in parallel to a pin; each of said first transistors receiving a different control signal at its gate terminal so as to be selectively controlled;
  monitoring the voltage at the pin using a feedback loop to generate digital signals;
  changing a digital value of the digital signals to generate modified digital signals by receiving a first value and adding the first value to the digital value or subtracting the first value from the digital value;
  converting the modified digital signals to an analog signal; and
  setting the on-chip termination resistance of the first transistors in response to the analog signal using second transistors.

16. The method defined in claim 15 wherein monitoring the voltage at the pin further comprises monitoring the voltage at the pin using a comparator, and transmitting an output signal of the comparator to a counter circuit, wherein the counter circuit generates the digital signals.

17. The method defined in claim 15 further comprising:
  disabling one of the first transistors by turning off one of the second transistors.

18. The method defined in claim 17 further comprising:
  selectively coupling the analog signal to the second transistors using multiplexers.

19. The method defined in claim 18 wherein disabling one of the first transistors further comprises turning off one the second transistors using one of the multiplexers and coupling a gate of one of the first transistors to a supply voltage.

20. The method defined in claim 15 wherein setting the on-chip termination resistance of the first transistors in response to the analog signal using second transistors comprises selectively receiving the analog signal, dividing the voltage of the analog signal, and providing the divided analog signal voltage to one of the first transistors.

21. An integrated circuit comprising:
  a plurality of transistors coupled to a pin, each of said plurality of transistors receiving a different control signal at its gate terminal so as to be selectively controlled;
  a comparator having a first input coupled to the pin and a second input coupled to a reference voltage;
  a counter having an input coupled to an output of the comparator;
  a biasing circuit to receive a digital count from the counter and to convert the digital count to an analog voltage;
  a plurality of control circuits to enable or disable the plurality of transistors; and
  a divider circuit, the divider circuit to receive the analog voltage, divide the analog voltage, and provide the divided analog voltage to one of the plurality of transistors.

22. The integrated circuit of claim 21 wherein the reference voltage is approximately equal to one-half a supply voltage.

23. The integrated circuit of claim 21 wherein the divider circuit comprises:

a pass transistor coupled between a data input and a gate of one of the plurality of transistors; and an impedance coupled to the gate of one of the plurality of transistors.

24. The integrated circuit of claim 23 further comprising an adder circuit to receive a first signal and add the first signal to the digital count from the counter and to receive a second signal and subtract the second signal from the digital count from the counter.

25. The integrated circuit of claim 21 further comprising:

an adder circuit to adjust the digital count provided by the counter before it is converted to the analog voltage.

26. The integrated circuit according to claim 1 wherein the calibration circuit further comprises:

a selection circuit to selectively coupled the analog input to the voltage divider circuit.

27. The integrated circuit according to claim 1 wherein the calibration circuit further comprises:

a plurality of additional voltage divider circuits, the voltage divider circuits to divide the analog calibration signal voltage and provide the divided analog calibration signal voltages as the plurality of outputs to the plurality of parallel output transistors.

28. The integrated circuit of claim 8 wherein the adder circuit is further coupled to receive a second input signal, where the second input signal is subtracted from the count signals to generate the digital signals.

29. The integrated circuit according to claim 12 wherein the calibration circuit further comprises:

a selection circuit to selectively coupled the analog output signal to the voltage divider circuit.

\* \* \* \* \*